(12) United States Patent
Kang et al.

(10) Patent No.: US 10,868,044 B2
(45) Date of Patent: Dec. 15, 2020

(54) ACTIVE LAYER, THIN-FILM TRANSISTOR ARRAY SUBSTRATE COMPRISING THE SAME, AND DISPLAY DEVICE COMPRISING THE SAME

(71) Applicant: LG Display Co., Ltd., Seoul (KR)

(72) Inventors: Jiyeon Kang, Seongnam-si (KR); Changeun Kim, Gunpo-si (KR); Jeongeun Baek, Eunpyeong-gu (KR); Sungjin Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 269 days.

(21) Appl. No.: 15/385,598

(22) Filed: Dec. 20, 2016

(65) Prior Publication Data
US 2017/0186776 A1    Jun. 29, 2017

(30) Foreign Application Priority Data
Dec. 28, 2015   (KR) .................. 10-2015-0187704

(51) Int. Cl.
*H01L 27/12*    (2006.01)
*H01L 29/786*   (2006.01)
(Continued)

(52) U.S. Cl.
CPC ........ *H01L 27/1222* (2013.01); *G02F 1/1368* (2013.01); *H01L 27/1225* (2013.01); *H01L 27/283* (2013.01); *H01L 27/3274* (2013.01); *H01L 29/1606* (2013.01); *H01L 29/267* (2013.01); *H01L 29/7869* (2013.01); *H01L 29/78606* (2013.01); *H01L 29/78618* (2013.01); *H01L 29/78684* (2013.01);
(Continued)

(58) Field of Classification Search
None
See application file for complete search history.

(56) References Cited

U.S. PATENT DOCUMENTS

| | | | |
|---|---|---|---|
| 2009/0194765 A1* | 8/2009 | Liau | H01L 21/0254 257/43 |
| 2011/0084252 A1* | 4/2011 | Wu | B82Y 30/00 257/40 |

(Continued)

FOREIGN PATENT DOCUMENTS

| | | |
|---|---|---|
| CN | 104538453 A | 4/2015 |
| JP | 2004-266272 A | 9/2004 |
| JP | 2011-082517 A | 4/2011 |

OTHER PUBLICATIONS

Japanese Office Action, dated Oct. 17, 2017 for the corresponding Japanese patent application No. 2016-243583.
(Continued)

*Primary Examiner* — Edward J Glick
*Assistant Examiner* — David Y Chung
(74) *Attorney, Agent, or Firm* — Polsinelli PC

(57) ABSTRACT

Carbon allotropes, a thin-film transistor array substrate comprising the same, and a display device comprising the same are disclosed. The thin-film transistor array substrate comprising a substrate, a gate electrode on the substrate, a gate insulating film on the gate electrode, an active layer positioned on the gate insulating film and comprising a semiconductor material and a plurality of carbon allotropes, and a source electrode and a drain electrode that make contact with the active layer.

12 Claims, 7 Drawing Sheets

(51) Int. Cl.
*G02F 1/1368* (2006.01)
*H01L 27/28* (2006.01)
*H01L 27/32* (2006.01)
*H01L 29/16* (2006.01)
*H01L 29/267* (2006.01)
*H01L 51/05* (2006.01)

(52) U.S. Cl.
CPC .... *H01L 29/78696* (2013.01); *H01L 51/0566* (2013.01); *G02F 2202/10* (2013.01)

(56) References Cited

U.S. PATENT DOCUMENTS

| | | | | |
|---|---|---|---|---|
| 2011/0102724 A1* | 5/2011 | Ono | .................. | G02F 1/133514 349/143 |
| 2011/0133189 A1* | 6/2011 | Yang | .................... | H01L 29/165 257/57 |
| 2011/0291068 A1* | 12/2011 | Kobayashi | ........ | H01L 29/66742 257/9 |
| 2014/0014905 A1* | 1/2014 | Lee | ......................... | H01L 29/78 257/29 |
| 2014/0097403 A1 | 4/2014 | Heo et al. | | |
| 2015/0108499 A1* | 4/2015 | Alptekin | ............. | H01L 21/0237 257/77 |
| 2015/0123110 A1* | 5/2015 | Hsieh | .................. | H01L 29/7869 257/43 |
| 2015/0270324 A1* | 9/2015 | Yoneya | ............... | H01L 51/0533 257/40 |
| 2015/0318401 A1 | 11/2015 | Duan et al. | | |
| 2016/0334918 A1* | 11/2016 | Hu | .................... | H01L 29/78693 |
| 2017/0054033 A1* | 2/2017 | Lee | .................. | H01L 29/78696 |

OTHER PUBLICATIONS

European Search Report dated May 11, 2017 in corresponding European patent application No. 16204960.

* cited by examiner

ACTIVE LAYER, THIN-FILM TRANSISTOR ARRAY SUBSTRATE COMPRISING THE SAME, AND DISPLAY DEVICE COMPRISING THE SAME

CROSS-REFERENCE TO RELATED APPLICATION

This application claims the priority benefit of Korean Patent Application No. 10-2015-0187704 filed in the Republic of Korea on Dec. 28, 2015, which is incorporated herein by reference in its entirety for all purposes as if fully set forth herein.

BACKGROUND

Field of the Disclosure

The present disclosure relates to a display device, and more particularly, to an active layer, a thin-film transistor array substrate comprising the same, and a display device comprising the same. Although the present disclosure is suitable for a wide scope of applications, it is particularly suitable for improving device characteristics of the display device by implementing an active layer formed of carbon allotropes.

Description of the Background

With the development of multimedia, flat panel displays (FDPs) are becoming more and more important nowadays. In line with this, a variety of flat panel displays such as liquid crystal displays (LCDs), plasma display panels (PDPs), field emission displays (FEDs), organic light emitting displays (OLEDs), etc. are being put to practical use.

Display devices are addressed with either a passive-matrix addressing scheme or an active-matrix addressing scheme using thin-film transistors. In the passive-matrix addressing scheme, an anode and a cathode intersect each other and selected lines are addressed. In contrast, in the active-matrix addressing scheme, each pixel electrode is attached to a thin-film transistor and switched on or off.

For a thin-film transistor, durability and electrical reliability, which are required to ensure long lifetime, are very important, as well as the fundamental characteristics such as electron mobility and leakage current, etc. An active layer of the thin-film transistor can be one of amorphous silicon, polycrystalline silicon, and oxide semiconductor. Main advantages of amorphous silicon are a simplified deposition process and a low production cost, but it has a low electron mobility of 0.5 $cm^2$/Vs. Oxide semiconductor has an on/off ratio of about $10^8$ and a low leakage current, but with an electron mobility of 10 $cm^2$/Vs, which is lower compared to polycrystalline silicon. Polycrystalline silicon has a high electron mobility of about 100 $cm^2$/Vs, but has a lower on/off ratio compared to oxide semiconductor and it costs a lot to apply polycrystalline silicon in large-area electronics. In this regard, there is ongoing research to improve the characteristics of thin-film transistors, including electron mobility, leakage current, and on/off ratio, etc.

SUMMARY

An aspect of the present disclosure is to provide an active layer, which can improve device characteristics by comprising carbon allotropes, a thin-film transistor array substrate comprising the same, and a display device comprising the same.

In one aspect, there is provided an active layer comprising a semiconductor material and a plurality of carbon allotropes.

The carbon allotropes are dispersed within the semiconductor material and form a plurality of domains.

Each domain is formed by chemical bonding between the carbon atoms in the carbon allotropes.

The carbon allotropes have a one-dimensional or two-dimensional structure.

The carbon allotropes are one of reduced graphene oxide (rGO), unoxidized graphene, graphene nanoribbons, and mixtures thereof.

The semiconductor material is a ceramic semiconductor or an organic semiconductor.

The carbon allotrope content is 0.05 to 0.1 wt % based on 100 wt % of the semiconductor material content.

In one aspect, there is provided a thin-film transistor array substrate comprising a substrate, a gate electrode on the substrate, a gate insulating film on the gate electrode, an active layer positioned on the gate insulating film and comprising a semiconductor material and a plurality of carbon allotropes, and a source electrode and a drain electrode that make contact with the active layer.

The carbon allotropes are dispersed within the semiconductor material and form a plurality of domains.

The domains are positioned at a channel in the active layer.

Each domain is formed by chemical bonding between the carbon atoms in the carbon allotropes.

The carbon allotropes have a one-dimensional or two-dimensional structure.

The carbon allotropes are either reduced graphene oxide (rGO), unoxidized graphene, graphene nanoribbons, or mixtures thereof.

The semiconductor material is a ceramic semiconductor or an organic semiconductor.

The carbon allotrope content is 0.05 to 0.1 wt % based on 100 wt % of the semiconductor material content.

In one aspect, there is provided a display device comprising, a thin-film transistor array substrate, an organic insulating film on the thin-film transistor array substrate, and a pixel electrode on the organic insulating film.

The display device further comprising an organic light-emitting diode electrically connected to the pixel electrode, an encapsulation layer on the organic light-emitting diode, and a cover window on the encapsulation layer.

The display device further comprising a common electrode positioned in the same plane as the pixel electrode or under the pixel electrode, spaced apart from the pixel electrode, and a liquid crystal layer on the common electrode.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate aspects of the disclosure and together with the description serve to explain the principles of the disclosure.

In the drawings.

DETAILED DESCRIPTION

Figure 1:
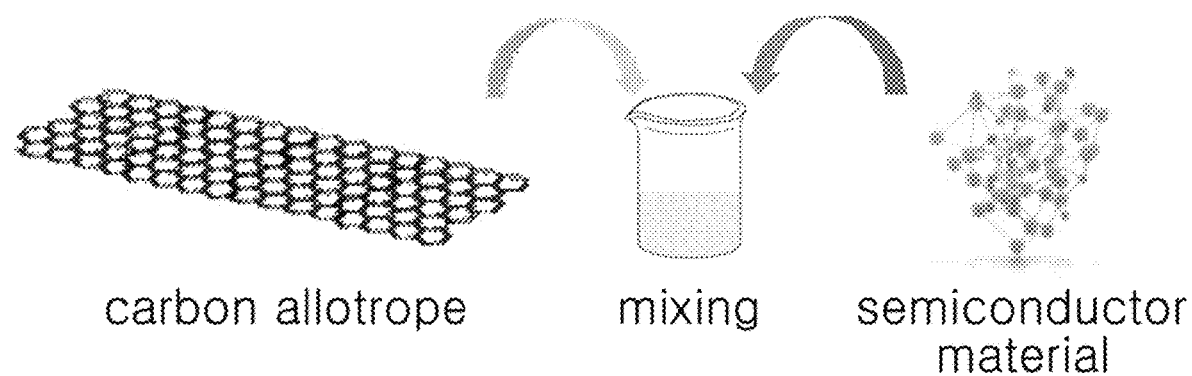
FIGS. 1 and 2 are views showing a process of making a carbon allotrope-semiconductor composition according to the present disclosure.

Hereinafter, exemplary aspects of the present disclosure will be described in detail with reference to the accompanying drawings. Like reference numerals designate substantially like elements throughout the specification. In the following description, detailed descriptions of well-known functions or configurations associated with the present disclosure will be omitted if they are deemed to unnecessarily obscure the subject matters of the present disclosure. The names of the elements used in the following description may be selected for ease of writing the specification, and may be different from the names of parts in actual products.

A display device according to the present disclosure to be disclosed below may be an organic light-emitting display, a liquid crystal display, an electrophoresis display, etc. The present disclosure will be described with respect to a liquid crystal display. The liquid crystal display is composed of a thin-film transistor array substrate with pixel electrodes and a common electrode formed on thin-film transistors, a color filter substrate, and a liquid crystal layer interposed between the two substrates. Such a liquid crystal display, liquid crystals are driven by an electric field vertically or horizontally applied to the common electrode and the pixel electrodes. The display device according to the present disclosure is also applicable to organic light-emitting displays. For example, an organic light-emitting display comprises first and second electrodes connected to thin-film transistors and an emissive layer of organic materials situated between the two electrodes. As such, a hole from the first electrode and an electron from the second electrode recombine within the emissive layer, forming an exciton, i.e., a hole-electron pair. Then, energy is created as the exciton returns to the ground state, thereby causing the organic light-emitting display to emit light. An active layer comprising carbon allotropes according to the present disclosure to be described later can be used for the thin-film transistors of the above display device.

Hereinafter, aspects of the present disclosure will be described with reference to the attached drawings.

The present disclosure discloses a thin-film transistor comprising carbon allotropes and a semiconductor material, and more particularly, a thin-film transistor with an active layer comprising carbon allotropes and a semiconductor material. The thin-film transistor is used as a switching element or driving element for a display device.

Carbon Allotropes

Carbon allotropes disclosed in the present disclosure refer to polycyclic aromatic molecules of covalently bonded carbon atoms. Covalently bonded carbon atoms are in repeating units, which may form a ring of 6 elements. Also, the covalently bonded carbon atoms may comprise either a ring of 5 elements or a ring of 6 elements or both of them. The carbon allotropes may be a single layer, or may comprise multiple layers of carbon allotropes stacked on one another. The carbon allotropes have a one-dimensional or two-dimensional structure. The carbon allotropes have a maximum thickness of about 100 nm, specifically, about 10 nm to 90 nm, or about 20 nm to 80 nm.

Carbon allotropes can be produced by the following four methods: physical peeling, chemical vapor deposition, chemical peeling and epitaxial growth. The physical peeling is a method of producing carbon allotrope sheets by applying Scotch tape to a graphite sample and then peeling it off. In the chemical vapor deposition, gaseous or vaporous carbon precursors with high kinetic energy adsorb on the surface of a substrate where carbon allotropes are to be grown, and then decompose into carbon atoms. These carbon atoms are packed together, thus growing crystalline allotropes of carbon. The chemical peeling uses the oxidation-reduction property of graphite, in which graphite is treated with an acidic mixture of sulfuric acid and nitric acid to produce carbon allotrope plates with carboxyl groups at their edges. These are converted to acid chlorides by treatment with thionyl chloride; next, they are converted to the corresponding carbon allotrope amide via treatment with octadecylamine Refluxing the resulting material in a solvent such as tetrahydrofurane leads to size reduction and folding of individual sheets of carbon allotrope sheets. In the epitaxial growth, silicon carbide (SiC) is heated to a high temperature of 1,500° C. to remove silicon (Si), and the remaining carbon atoms C form a carbon allotrope.

Carbon allotropes of this disclosure may include one of reduced graphene oxide (rGO), unoxidized graphene, and graphene nanoribbons. The reduced graphene oxide is a reduced form of graphene oxide (GO), which is obtained by oxidizing graphite with a strong acid, chemically processing it to make tiny particles of graphene oxide, and then reducing these particles of graphene oxide. Unoxidized graphene refers to a carbon allotrope which is produced by any of the above-mentioned carbon allotrope production methods, but without the oxidation-reduction process. Graphene nanoribbons are strips of graphene that measure in nanometers, exhibiting a different energy bandgap depending on their width. Graphene nanoribbons can be made by synthesis from monomers comprising carbon allotropes or by cutting carbon nanotubes and opening them up flat. Besides the above-mentioned types of carbon allotropes, carbon allotropes of this disclosure may have well-known carbon allotropic structures such as graphene nanomeshes.

Carbon allotropes of this disclosure come in the shape of flakes. Carbon allotrope flakes can be produced by coating a substrate with a dispersion solution with carbon allotropes dispersed in a solvent, drying the solvent, and then applying a physical force to the coating. The physical force can be applied by using a ball mill, bead mill, and ultrasonic homegenizer, etc.

Semiconductor Material

A semiconductor materials used in this disclosure may be a ceramic semiconductor or organic semiconductor material that can be coated with a solution.

Ceramic semiconductors are materials that use the electrical properties of ceramics. In the case of ceramics, electrons are held in ions or atoms, so they are not free to move, leading to conduction of almost no electricity. However, when an electric field is applied from the outside, the held electrons are re-arranged by reacting with the electric field, making the electrons change state and move. Ceramic semiconductors include oxides, carbides, and nitrides, which are produced by bonding metal elements such as silicon (Si), germanium (Ge), selenium (Se), aluminum (Al), titanium (Ti), and zirconium (Zr) to oxygen (O), carbon (C), nitrogen (N), etc. One of the most common ceramic semiconductors is barium titanate (BaTiO3).

Organic semiconductors are organic compounds with semiconducting properties, which include polymer organic semiconductors and low-molecular organic semiconductors. The polymer organic semiconductors may include F8T2 (Poly[(9,9-dioctylfluorenyl-2,7-diyl)-co-bithiophene]), PBDTBOTPDO (Poly[(5,6-dihydro-5-octyl-4,6-dioxo-4H-thieno[3,4-C]pyrrole-1,3-diyl){4,8-bis[(2-butyloctyfloxy]benzo[1,2-b:4,5-b']dithiophene-2,6-diyl}]), PBDT-TPD (Poly[ [5-(2-ethylhexyl)-5,6-dihydro-4,6-dioxo-4H-thieno[3,4-c]pyrrole-1,3-diyl][4,8-bis[(2-ethylhexyfloxy]benzo[1,2-b:4,5-b']dithiophene-2,6-diyl]]), PBDTTT-CF (Poly[1-(6-{4,8-bis[(2-ethylhexyl)oxy]-6-methylbenzo[1,2-b:4,5-b']dithiophen-2-yl}-3-fluoro-4-methylthieno[3,4-b]thiophen-2-yl)-1-octanone]), PCDTBT (Poly[N-9'-heptadecanyl-2,7-carbazole-alt-5,5-(4',7'-di-2-thienyl-2',1',3'-benzothiadiazole)], Poly[ [9-(1-octylnonyl)-9H-carbazole-2,7-diyl]-2,5-thiophenediyl-2,1,3-b enzothiadiazole-4,7-diyl-2,5-thiophenediyl]), PCPDTBT (Poly[2,6-(4,4-bis-(2-ethylhexyl)-4H-cyclopenta[2,1-b;3,4-b']dithiophene)-alt-4,7(2,1,3-benzothiadiazole)]), PFO-DBT (Poly[2,7-(9,9-dioctylfluorene)-alt-4,7-bis(thiophen-2-yl)benzo-2,1,3-thiadiazole]), PTAA (Poly[bis(4-phenyl)(2,4,6-trimethylphenyl)amine]), Poly[(5,6-dihydro-5-octyl-4,6-dioxo-4H-thieno[3,4-c]pyrrole-1,3-diyl) [4,8-bis[(2-ethylhexyl)oxy]benzo[1,2-b:4,5-b']dithiophene-2,6-diyl]], F8BT (Poly[(9,9-di-n-octylfluorenyl-2,7-diyl)-alt-(benzo[2,1,3]thiadiazol-4,8-diyl)]), P3DDT (Poly(3-dodecylthiophene-2,5-diyl)), P3HT (Poly(3-hexylthiophene-2,5-diyl)), MDMOPPV (Poly[2-methoxy-5-(3',7'-dimethyloctyloxy)-1,4-phenylenevinylene]), MEH-PPV (Poly[2-methoxy-5-(2-ethylhexyloxy)-1,4-phenylenevinylene]), P3OT (Poly(3-octylthiophene-2,5-diyl)), and PTB7 (Poly({4,8-bis[(2-ethylhexyl)oxy]benzo[1,2-b:4,5-b']dithiophene-2,6-diyl}{3-fluoro-2-[(2-ethylhexyl)carbonyl]thieno[3,4-b]thiophenediyl})).

The low-molecular organic semiconductors may include TIPS-pentacene (6,13-Bis(triisopropylsilylethynyl)pentacene), TESPentacene (6,13-Bis((triethylsilyl)ethynyl)pentacene), DH-FTTF (5,5'-Bis(7-hexyl-9H-fluoren-2-yl)-2,2'-bithiophene), diF-TES-ADT (2,8-Difluoro-5,11-bis(triethylsilylethynyl)anthradithiophene), DH2T (5,5'-Dihexyl-2,2'-bithiophene), DH4T (3,3'''-Dihexyl-2,2':5',2'':5'',2'''-quaterthiophene), DH6 T (5,5'''''-Dihexyl-2,2':5',2'':5'',2''':5''',2'''':5'''',2'''''-sexithiophene), DTS (PTTh2)2(4,4'-[4,4-Bis(2-ethylhexyl)-4H-silolo[3,2-b:4,5-b']dithiophene-2,6-diyl]bis[7-(5'-hexyl-[2,2'-bithiophen]-5-yl)-[1,2,5]thiadiazolo[3,4-c]pyridine], 5,5'-Bis{[4-(7-hexylthiophen-2-yl)thiophen-2-yl]-[1,2,5]thiadiazolo[3,4-c]pyridine}-3,3'-di-2-ethylhexylsilylene-2,2'-bithiophene), SMDPPEH (2,5-Di-(2-ethylhexyl)-3,6-bis-(5''-n-hexyl-[2,2',5',2'']terthiophen-5-yl)-pyrrolo[3,4-c]pyrrole-1,4-dione), and TES-ADT (5,11-Bis(triethylsilylethynyl)anthradithiophene).

As the above-mentioned organic semiconductor of the present disclosure, two or more types of polymer or low-molecular organic semiconductors may be used, or different types of polymer organic semiconductors may be used, or different types of low-molecular organic semiconductors may be used.

Carbon Allotrope-Semiconductor Composition

Figure 2:
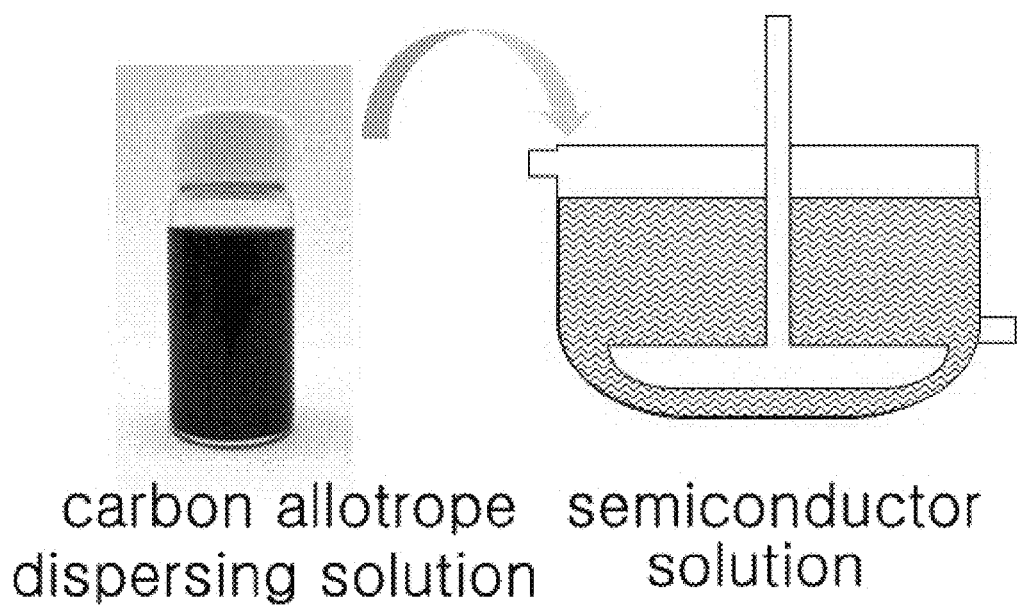

FIGS. 1 and 2 are views showing a process of making a carbon allotrope-semiconductor composition according to the present disclosure.

In the present disclosure, a carbon allotrope-semiconductor composition may be made by mixing carbon allotropes and a semiconductor material.

More particularly, referring to FIG. 1, carbon-allotrope flakes and a semiconductor material are prepared. The carbon-allotrope flakes and the semiconductor material may be prepared as a powder. The carbon allotrope-semiconductor composition may be made by putting the carbon-allotrope flakes and the semiconductor material in a solvent and mixing them together. Unlike the stated above, referring to FIG. 2, the carbon allotrope-semiconductor composition of the present disclosure may be made by mixing a semiconductor solution containing a semiconductor material and a carbon allotrope dispersion solution with carbon allotropes dispersed in a solvent.

The solvent may comprise one or more of the followings: water; an alcohol selected from ethanol, methanol, isopropyl alcohol, buthanol, 2-ethylhexyl alcohol, methoxypentanol, butoxyethanol, ethoxyethoxy ethanol, butoxyethoxy ethanol, methoxy propoxy propanol, texanol, terpineol, and any combination thereof; tetrahydrofuran (THF); glycerol, ethylene glycol, triethylene glycol, polyethylene glycol, propylene glycol, dipropylene glycol, dihexylene glycol, or alkyl ethers thereof; and glycerin, N-methyl-2-pyrrolidinone (NMP), 2-pyrrolidone, acetylacetone, 1,3-dimetylimidazolinon, thiodiglycol, dimethyl sulfoxide (DMSO), N,N-dimethyl acetamide (DMAc), dimethylformamide (DMF), sulfolane, diethanolamine, triethanolamine, and any combination thereof.

To uniformly disperse carbon allotropes, the carbon allotrope-semiconductor composition may be exposed to ultrasonic waves. The ultrasonic irradiation is applied in several separate time intervals. For example, the carbon allotropes and the semiconductor material are mixed together and irradiated with high ultrasonic waves (about 250 W) by an ultrasonic disintegrator for 30 minutes. By repeating this process, a carbon allotrope-semiconductor composition with uniformly-dispersed carbon allotropes may be made.

The carbon allotrope content used in the carbon allotrope-semiconductor composition of the present disclosure may be 0.05 to 0.1 wt % based on 100 wt % of the semiconductor material content. If the carbon allotrope content is equal to or greater than 0.05 wt % based on 100 wt % of the semiconductor material content, the charge mobility can be improved. If the carbon allotrope content is equal to or less than 0.1 wt % based on 100 wt % of the semiconductor material content, a decrease in an on/off ratio can be prevented.

Hereinafter, a thin-film transistor array substrate comprising an active layer using the above-described carbon allotrope-semiconductor composition and a display device comprising the same will be described.

Figure 3:
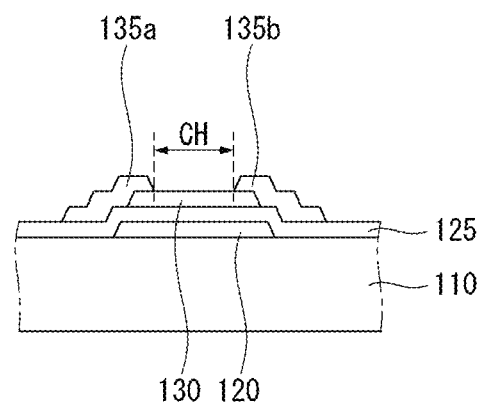
FIG. 3 is a cross-sectional view of a thin-film transistor array substrate according to an aspect of the present disclosure.
Figure 4:
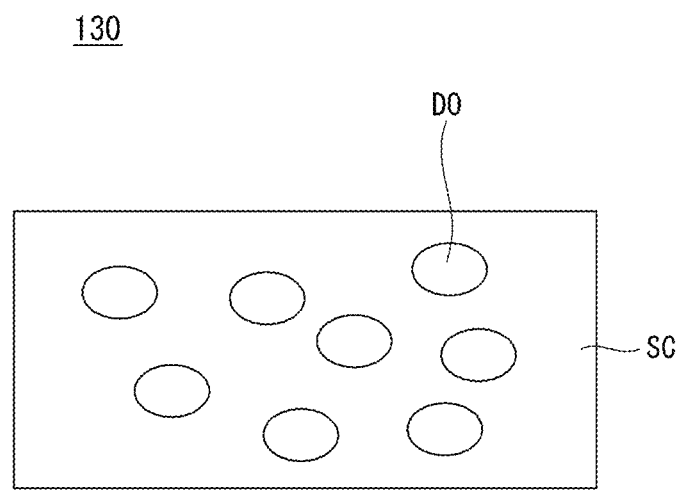
FIG. 4 is a top plan view of an active layer according to an aspect of the present disclosure.
Figure 5:
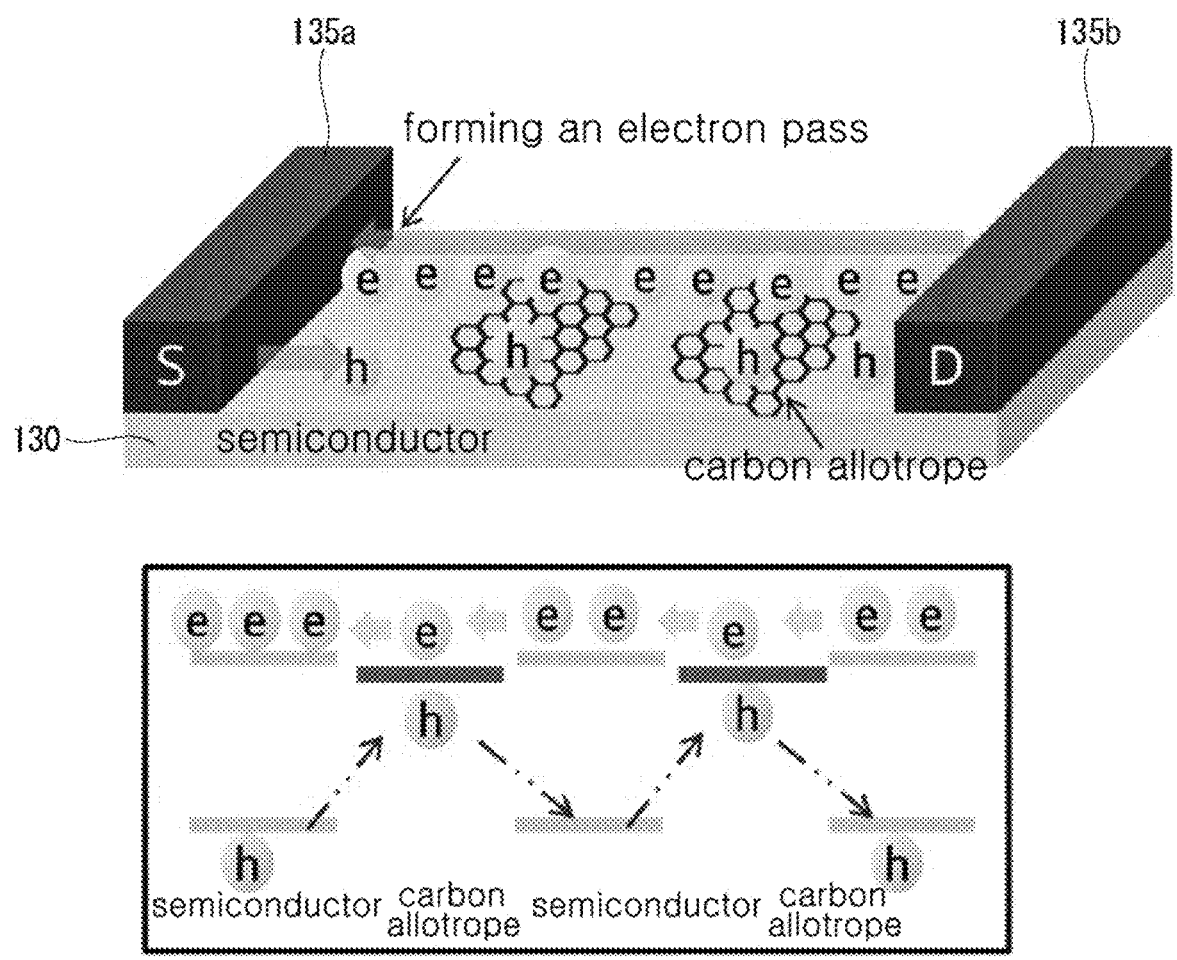
FIG. 5 is a schematic diagram showing movement of electrons and holes in a thin-film transistor according to an aspect of the present disclosure.
Figure 6:
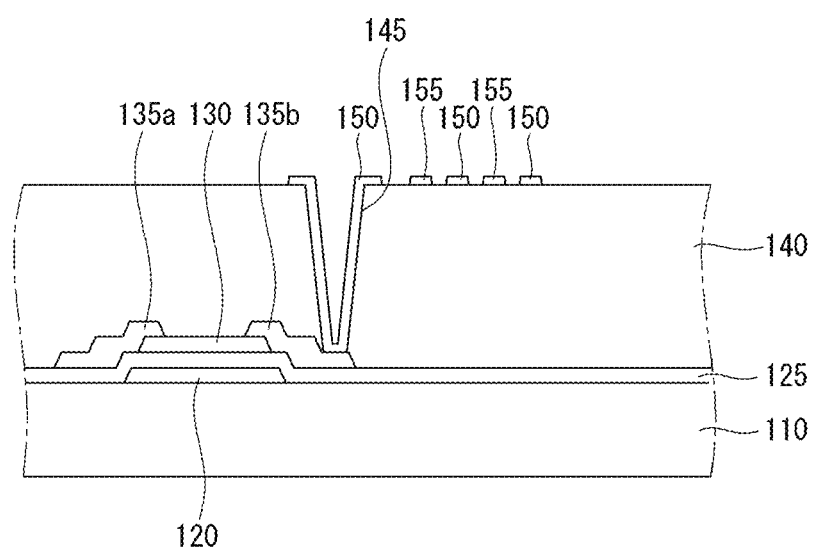
FIGS. 6 and 7 are cross-sectional views of a display device according to an aspect of the present disclosure.
Figure 7:
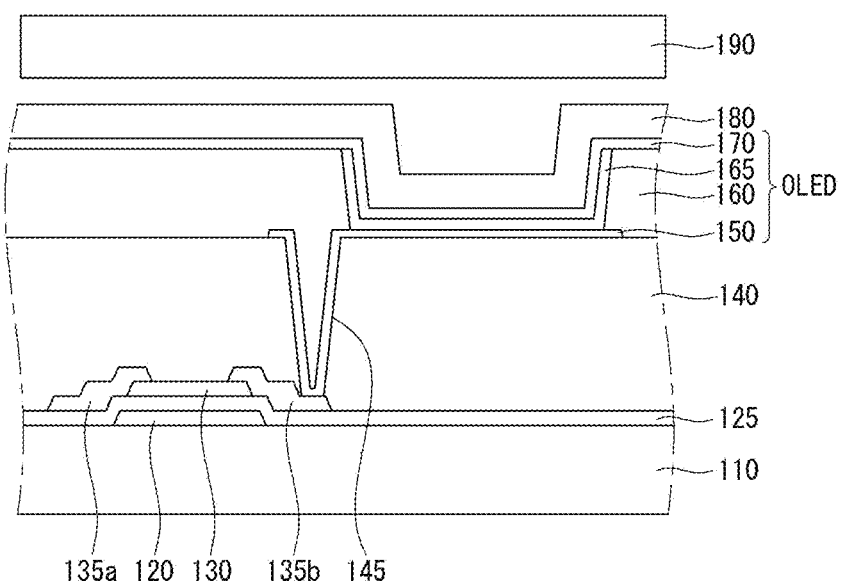

FIG. 3 is a cross-sectional view of a thin-film transistor array substrate according to an aspect of the present disclosure. FIG. 4 is a top plan view of an active layer according to an aspect of the present disclosure. FIG. 5 is a schematic diagram showing movement of electrons and holes in a thin-film transistor according to an aspect of the present disclosure. FIGS. 6 and 7 are cross-sectional views of a display device according to an aspect of the present disclosure.

Thin-Film Transistor Array Substrate

A thin-film transistor array substrate disclosed in the present disclosure will be described with respect to a bottom-gate type thin-film transistor with a gate electrode positioned under an active layer. However, the present disclosure is not limited to this but also applicable to a top-gate type thin-film transistor with a gate electrode positioned over an active layer.

Referring back to FIG. 3, a gate electrode 120 is positioned on a substrate 110. The substrate 110 is made of transparent or opaque glass, plastic, or metal. The gate electrode 120 is composed of a single layer or multiple layers formed of one of copper (Cu), molybdenum (Mo), aluminum (Al), chrome (Cr), gold (Au), titanium (Ti), nickel (Ni), neodymium (Nd), tantalum (Ta), and tungsten (W), or alloys thereof. A gate insulating film 125 for insulating the gate electrode 120 is positioned on the gate electrode 120. The gate insulating film 125 may be formed of one of a silicon oxide film (SiOx), a silicon nitride film (SiNx), and multiple layers thereof.

An active layer 130 is positioned on the gate electrode 120. The active layer 130 is made from the carbon allotrope-semiconductor composition of this disclosure. More specifically, a carbon allotrope-semiconductor thin film is formed by coating the above carbon allotrope-semiconductor composition on the substrate 110 where the gate insulating film 125 is formed. The carbon allotrope-semiconductor composition may be applied by spin coating, slit coating, screen printing, ink-jet printing, etc., and any method can be used as long as it involves coating a solution. The solvent is removed by heating the carbon allotrope-semiconductor thin film to 250° C. for 2 hours. Then, the carbon allotrope-semiconductor thin film is patterned by photolithography, thus forming the active layer 3 of the present disclosure.

A source electrode 135 making contact with one side of the active layer 130 and a drain electrode 135b making contact with the other side of the active layer 130 are positioned on the active layer 130. A source electrode 135a and the drain electrode 135b may be composed of a single layer or multiple layers. The source electrode 135a and the drain electrode 135b, if composed of a single layer, may be made of one of molybdenum (Mo), aluminum (Al), chrome (Cr), gold (Au), titanium (Ti), nickel (Ni), neodymium (Nd), copper (Cu), and alloys thereof. The source electrode 135a and the drain electrode 135b, if composed of multiple layers, may be formed of two layers of molybdenum/aluminum-neodymium, molybdenum/aluminum, or titanium/aluminum, or three layers of molybdenum/aluminum-neodymium/molybdenum, molybdenum/aluminum/molybdenum, or titanium/aluminum/titanium.

The active layer 130 of this disclosure has a channel CH between the areas of contact with the source electrode 135a and the drain electrode 135b. The channel CH is a path in the active layer 130 through which electrons and holes move between the source electrode 135a and the drain electrode 135b.

Referring to FIGS. 4 and 5, in the active layer 130, carbon allotropes form a plurality of domains DO within a semiconductor material SC. The domains DO are separated from one another and dispersed within the semiconductor material SC. Each domain DO is formed by chemical bonding between the carbon atoms at the edges of the carbon allotropes. Each of Domains DO is chemically bonded in a random way, and also dispersed in a random way.

In the present disclosure, carbon allotropes are dispersed within the active layer 130 made of a semiconductor material. When a voltage is applied to the source electrode 135a and the drain electrode 135b, electrons and holes move to the channel in the active layer 130. Since the carbon allotropes are dispersed across the channel in the active layer 130, the electrons and holes within the semiconductor material move in proportion to the charge mobility of the semiconductor material and then move very fast in the carbon allotropes which become near-conductive. As electrons and holes move along the semiconductor and the carbon allotropes, the charge mobility can be improved greatly.

Notably, in the case of semiconductor materials, scattering happens when an electron moves, which leads to a low electron mobility. In contrast, scattering rarely occurs within carbon allotropes and this eliminates the risk of a decrease in electron mobility.

Moreover, the active layer 130 of this disclosure contains a small amount of carbon allotropes, so there is almost no path through which carriers move by contact (or chemical bonding) between the carbon allotropes. This can prevent an increase in an OFF current due to deterioration of the semiconducting properties of the active layer 130.

Now, a display device comprising a thin-film transistor array substrate according to the present disclosure will be described with reference to FIGS. 6 and 7. A redundant explanation of the above-described thin-film transistor array substrate will be omitted hereinbelow.

Display Device

Referring to FIG. 6, an organic insulating film 140 is positioned on the source electrode 135a and the drain electrode 135b. The organic insulating film 140 is for smoothing out irregularities beneath it, and may be made of an organic material such as photoacryl, polyimide, benzocyclobutene resin, acrylate resin, etc. The organic insulating film 140 comprises a via hole 145 exposing a portion of the drain electrode 135b. Although not shown, a passivation film made of silicon oxide (SiOx), silicon nitride (SiNx), or multiple layers thereof may be positioned on the source electrode 135a and the drain electrode 135b.

A pixel electrode 150 and a common electrode 155 are positioned on the organic insulating film 140. The pixel electrode 150 is connected to the drain electrode 135b through the via hole 145 in the organic insulating film 140. The pixel electrode 150 is made of a transparent and conductive material such as ITO (indium tin oxide) and IZO (indium zinc oxide). The common electrode 155 is made of the same material as the pixel electrode 150. The pixel electrode 150 and the common electrode 155 are arranged alternately and form a horizontal electric field between the pixel electrode 150 and the common electrode 155.

The aspects of the present disclosure have been described with respect to an IPS (in-plane switching) liquid crystal display in which a pixel electrode and a common electrode are in the same plane. However, the present disclosure is not limited to this, but instead the common electrode may be positioned under the pixel electrode or the common electrode may be positioned on a color filter array substrate opposite the thin-film transistor array substrate.

Referring to FIG. 7, a display device of this disclosure may be an organic light-emitting display comprising an organic light-emitting diode. More specifically, an organic insulating film 140 is positioned on the source electrode 135a and the drain electrode 135b. The organic insulating film 140 comprises the via hole 145 exposing the drain electrode 135b.

The pixel electrode 150 is positioned on the organic insulating film 140. The pixel electrode 150 is connected to the drain electrode 135b through the via hole 145 in the organic insulating film 140. A bank layer 160 is positioned on the pixel electrode 150. The bank layer 160 may be a pixel definition layer that defines a pixel by partially exposing the pixel electrode 150. An organic layer 165 is positioned on the bank layer 160 and the exposed pixel electrode 150. The organic layer 165 comprises an emissive layer that emits light by the recombination of an electron and a hole, and may comprise a hole injection layer, a hole transport layer, an electron transport layer, or an electron injection layer. An opposing electrode 170 is positioned on a substrate 110 where the organic film 165 is formed. The opposing electrode 170 can be a cathode, and may be made of magnesium (Mg), calcium (Ca), aluminum (Al), silver (Ag), or an alloy thereof which has a low work function. As such, an organic light-emitting diode OLED comprising the pixel electrode 150, the organic layer 165, and the opposing electrode 170 is formed.

An encapsulation layer 180 is positioned above the substrate 110 where the organic light-emitting diode OLED is formed. The encapsulation layer 180 encapsulates the substrate 110, including the underlying organic light-emitting diode OLED, and may be composed of an inorganic film, an organic film, or a multilayer structure thereof. A cover window 190 is positioned on the encapsulation layer 180 and constitutes an organic light-emitting display.

Now, test examples of an active layer made from a carbon allotrope-semiconductor composition according to an aspect of the present disclosure will be disclosed. The semiconductor material used is IGZO.

Test 1: Evaluation of Active Layer

Figure 8:
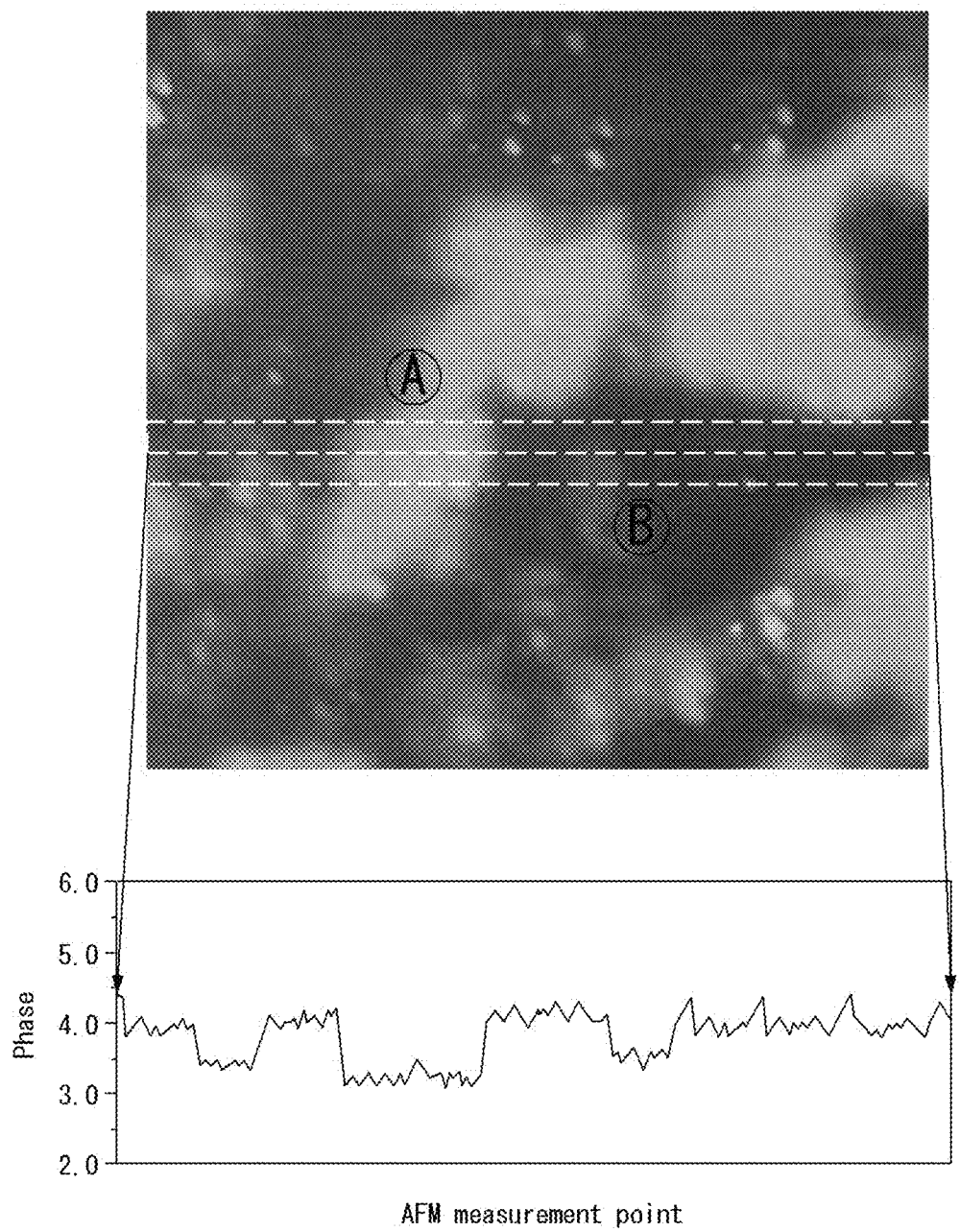
FIG. 8 is an atomic force microscopic (AFM) image of an active layer according to the present disclosure.
Figure 9:
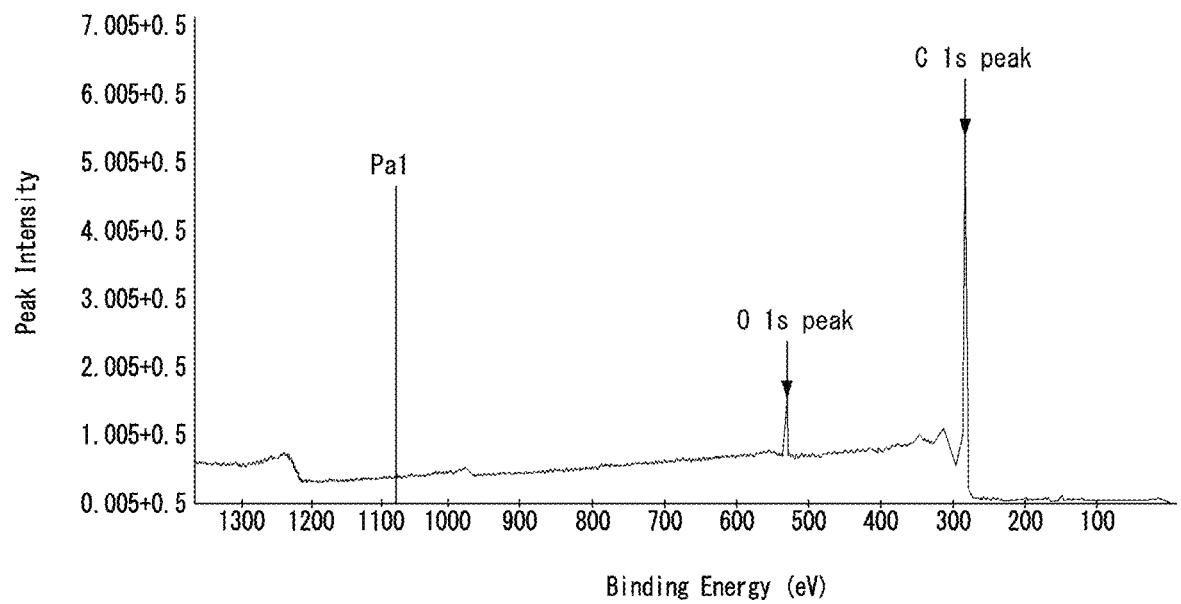
FIG. 9 is X-ray photoelectron spectroscopy (XPS) spectra for measurements of the area A of FIG. 8.
Figure 10:
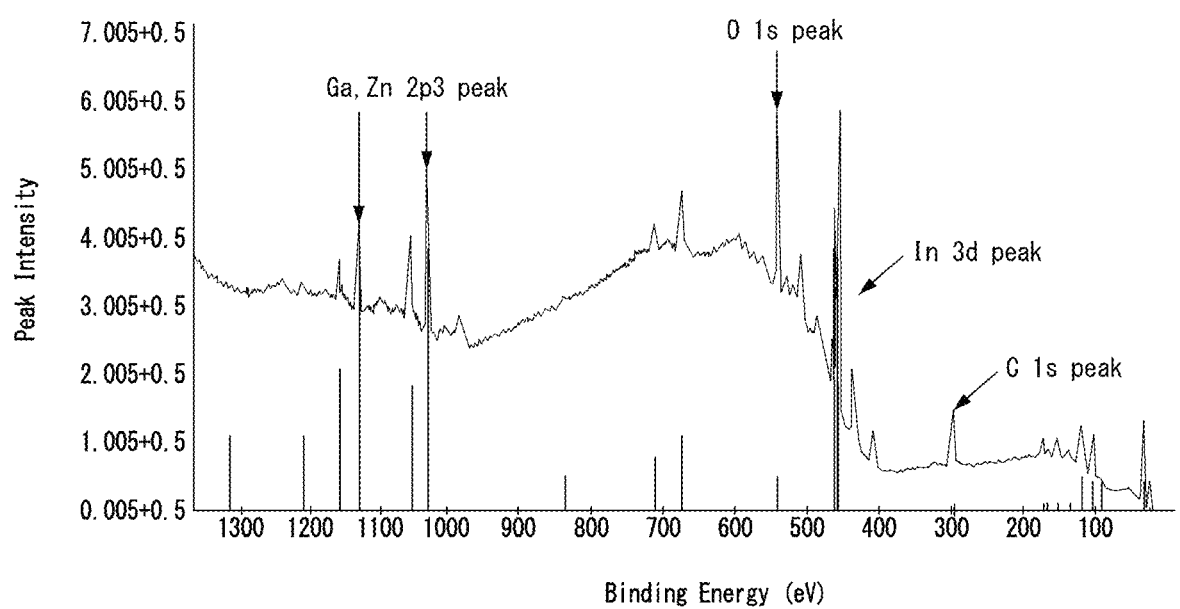
FIG. 10 is XPS spectra for measurements of the area B of FIG. 8.

FIG. 8 is an AFM image of an active layer according to the present disclosure. FIG. 9 is XPS spectra for measurements of the area A of FIG. 8. FIG. 10 is XPS spectra for measurements of the area B of FIG. 8.

Referring to FIG. 8, from the AFM (atomic-force microscope) image of the active layer, it can be observed that carbon allotropes are bonded together and form multiple domains Notably, there is a difference between the area with carbon allotropes and the area with no carbon allotropes, as is clear from the phase difference.

FIG. 9 is a graph of XPS (X-ray photoelectron spectroscopy) analysis of the area with domains of carbon allotropes. FIG. 10 is a graph of XPX analysis of the area with no domains of carbon allotropes. Referring to FIG. 9, the carbon (C) is peak and oxygen (O) is peak for the elements of carbon allotropes are observed. Referring to FIG. 10, it is observed that the area with no domains of carbon allotropes has main peaks for indium (In), gallium (GA), zinc (Zn), and oxygen (O), and that the carbon (C) is peak in this area is much lower compared to that in the area with domains of carbon allotropes.

From these results, it can be concluded that carbon allotropes form domains in the active layer made from the carbon allotrope-semiconductor composition of this disclosure.

Test 2: Evaluation of Thin-Film Transistors

Example

As shown above in FIG. 2, a thin-film transistor is made by forming an active layer comprising carbon allotropes and a semiconductor in a bottom-gate type thin-film transistor. The semiconductor material used is IGZO.

Comparative Example

A thin-film transistor is made in the same way as the previous Example, except that the active layer is made solely from pure IGZO.

Current-voltage curves of the thin-film transistors made according to the above Example and Comparative Example are measured and shown in FIG. 11, and their threshold voltages and ON currents are shown in the following Table 1.

TABLE 1

|  | Threshold Voltage (Vth, V) | ON current (A) |
| --- | --- | --- |
| Comparative Example | −25 | $4 \times 10^{-6}$ A |
| Present Disclosure | −20 | $8 \times 10^{-6}$ A |

Figure 11:
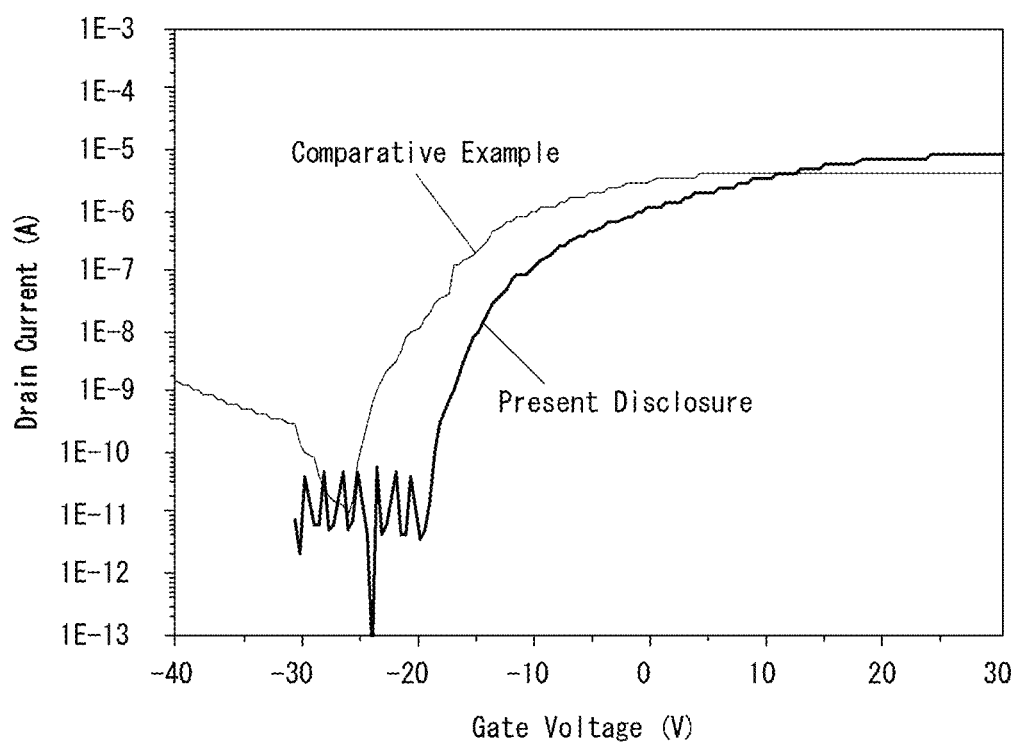
FIG. 11 is a graph showing current-voltage curves of thin-film transistors with comparative example and the present disclosure.

Referring to Table 1 and FIG. 11, Comparative Example with the active layer made solely from IGZO shows a threshold voltage of −25 V and an ON current of $4\times10^{-6}$ A. In contrast, the present disclosure with the active layer comprising an IGZO semiconductor and carbon allotropes shows a threshold voltage of −20 V and an ON current of $8\times10^{-6}$ A.

From these results, it can be concluded that the thin-film transistor comprising an IGZO semiconductor and carbon allotropes have better threshold voltage and ON current characteristics compared to the thin-film transistor comprising an active layer made solely from IGZO.

Accordingly, by forming an active layer in which carbon allotropes form a plurality of domains within a semiconductor material, the present disclosure can improve the charge mobility of the active layer. Moreover, the dispersion of the domains in the active layer can prevent the formation of a path through which carbon allotropes are connected to one another, causing charges to move. This can prevent a decrease in the on/off ratio of a thin-film transistor.

Although aspects have been described with reference to a number of illustrative aspects thereof, it should be understood that numerous other modifications and aspects can be devised by those skilled in the art that will fall within the spirit and scope of the principles of this disclosure. More particularly, numerous variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A thin-film transistor array substrate of a display device, comprising:
    a substrate;
    a gate electrode on the substrate;
    a gate insulating film on the gate electrode;
    an active layer positioned on the gate insulating film and comprising a non-carbon allotropic semiconductor material and a plurality of carbon allotropes;
    a source electrode contacting a source region; and
    a drain electrode contacting a drain region of the active layer,
    wherein the plurality of carbon allotropes is dispersed within the non-carbon allotropic semiconductor material to form a plurality of domains and each carbon allotrope domain is randomly dispersed to be isolated from each other to enhance a charge mobility of the non-carbon allotropic semiconductor material, and a content of the carbon allotropes is small enough not to form a carrier path in the active layer by the carbon allotropes, wherein the non-carbon allotropic semiconductor material includes a ceramic semiconductor, wherein the plurality of carbon allotropes includes graphene nanoribbons, wherein the content of the carbon allotropes includes about 0.05 to 0.1 wt % based on 100 wt % of a content of the non-carbon allotropic semiconductor material, wherein the non-carbon allotropic semiconductor material comprises IGZO, and wherein the plurality of domains are positioned at a channel between the source region and the drain region of the active layer.

2. The thin-film transistor array substrate of claim 1, wherein each of the domains is chemically bonded between carbon atoms in the carbon allotropes.

3. The thin-film transistor array substrate of claim 1, wherein the carbon allotropes have a one-dimensional or two-dimensional structure.

4. The thin-film transistor array substrate of claim 1, wherein the carbon allotropes include covalently bonded carbon atoms in repeating units of a ring of 5 or 6 elements or both.

5. The thin-film transistor array substrate of claim 1 where the carbon allotropes have a thickness not greater than about 100 nm.

6. A display device comprising:
a thin-film transistor array substrate, comprising;
  a substrate,
  a gate electrode on the substrate,
  a gate insulating film on the gate electrode,
  an active layer positioned on the gate insulating film and comprising a non-carbon allotropic semiconductor material and a plurality of carbon allotropes,
  a source electrode contacting a source region of the active layer, and
  a drain electrode contacting a drain regions of the active layer an organic insulating film on the thin-film transistor array substrate; and
a pixel electrode on the organic insulating film, wherein the plurality of carbon allotropes is dispersed within the non-carbon allotropic semiconductor material to form a plurality of domains and each carbon allotrope domain is randomly dispersed to be isolated from each other to enhance a charge mobility of the non-carbon allotropic semiconductor material, and a content of the carbon allotropes is small enough not to form a carrier path in the active layer by the carbon allotropes, wherein the non-carbon allotropic semiconductor material includes a ceramic semiconductor, wherein the plurality of carbon allotropes includes graphene nanoribbons, wherein the content of the carbon allotropes includes about 0.05 to 0.1 wt % based on 100 wt % of a content of the non-carbon allotropic semiconductor material, wherein the non-carbon allotropic semiconductor material comprises IGZO, and wherein the plurality of domains are positioned at a channel between the source region and the drain region of the active layer.

7. The display device of claim 6, further comprising:
an organic light-emitting diode electrically connected to the pixel electrode;
an encapsulation layer on the organic light-emitting diode; and
a cover window on the encapsulation layer.

8. The display device of claim 6, further comprising:
a common electrode positioned on the same plane as the pixel electrode or under the pixel electrode, spaced apart from the pixel electrode; and
a liquid crystal layer on the common electrode.

9. The display device of claim 6, wherein each domain is formed by a chemical bonding between carbon atoms in the carbon allotropes.

10. The display device of claim 6, wherein the carbon allotropes have a one-dimensional or two-dimensional structure.

11. The display device of claim 6, wherein the carbon allotropes include covalently bonded carbon atoms in repeating units of a ring of 5 or 6 elements or both.

12. The display device of claim 6, where the carbon allotropes have a thickness not greater than about 100 nm.

* * * * *